United States Patent
Chen et al.

(10) Patent No.: US 9,012,248 B2
(45) Date of Patent: Apr. 21, 2015

(54) METHOD FOR PACKAGING LIGHT EMITTING DIODE

(75) Inventors: Lung-Hsin Chen, Hsinchu (TW);
Wen-Liang Tseng, Hsinchu (TW);
Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 262 days.

(21) Appl. No.: 13/612,895

(22) Filed: Sep. 13, 2012

(65) Prior Publication Data

US 2013/0178003 A1   Jul. 11, 2013

(30) Foreign Application Priority Data

Jan. 10, 2012  (CN) .......................... 2012 1 0005383

(51) Int. Cl.
*H01L 33/50*  (2010.01)
*H01L 33/52*  (2010.01)
*H01L 33/00*  (2010.01)
*H01L 33/48*  (2010.01)

(52) U.S. Cl.
CPC ................ *H01L 33/50* (2013.01); *H01L 33/52* (2013.01); *H01L 33/0095* (2013.01); *H01L 33/483* (2013.01)

(58) Field of Classification Search
CPC ............... H01L 33/50; H01L 33/502; H01L 2933/0041; H01L 33/62; H01L 33/52; H01L 33/483; H01L 33/0095
USPC ................................ 257/98, 99, 100; 438/27
See application file for complete search history.

(56) References Cited

U.S. PATENT DOCUMENTS

| | | | |
|---|---|---|---|
| 2003/0173590 A1* | 9/2003 | Liu ................................ | 257/200 |
| 2005/0127385 A1* | 6/2005 | Reeh et al. ..................... | 257/98 |
| 2006/0102915 A1* | 5/2006 | Kim ................................ | 257/98 |
| 2010/0187556 A1* | 7/2010 | Kim et al. ........................ | 257/98 |
| 2011/0037091 A1* | 2/2011 | Fushimi ........................ | 257/98 |
| 2011/0220920 A1* | 9/2011 | Collins et al. .................. | 257/88 |
| 2011/0248305 A1* | 10/2011 | Ling ............................... | 257/98 |
| 2011/0284822 A1* | 11/2011 | Jung et al. ........................ | 257/13 |
| 2012/0255603 A1* | 10/2012 | Yu et al. ........................ | 136/256 |
| 2012/0291950 A1 | 11/2012 | Sugiyama et al. | |

FOREIGN PATENT DOCUMENTS

| | | |
|---|---|---|
| TW | 200952152 A | 12/2009 |
| TW | 201037865 A1 | 10/2010 |
| TW | 201137994 A1 | 11/2011 |

* cited by examiner

*Primary Examiner* — Michele Fan
*Assistant Examiner* — Nilufa Rahim
(74) *Attorney, Agent, or Firm* — Novak Druce Connolly Bove + Quigg LLP (57) ABSTRACT

A method for packaging an LED includes steps: providing a substrate with a circuit structure formed thereon, stacking the substrate on a supporting board, and arranging a plurality of LED dies on the substrate; providing a mold and a gelatinous-state fluorescent film, positioning the supporting board in the mold and covering the mold with the gelatinous-state fluorescent film to cooperatively define a receiving space among the fluorescent film, the mold and the supporting board, the substrate and the LED dies being received in the receiving space; exhausting air in the receiving space to attach the gelatinous-state fluorescent film on the LED dies; solidifying the gelatinous-state fluorescent film and removing the mold; forming an encapsulation on the substrate to cover the LED dies; cutting the substrate and removing the supporting board to obtain several individual LED packages.

8 Claims, 9 Drawing Sheets

METHOD FOR PACKAGING LIGHT EMITTING DIODE

BACKGROUND

1. Technical Field

The present disclosure generally relates to methods for packaging light emitting diodes (LEDs), and particularly to a method for manufacturing LED packages wherein fluorescent material conformably and directly covers an LED die.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

Generally, an LED includes a substrate, electrodes arranged on the substrate, a reflective cup arranged on the substrate, an LED die arranged in the reflective cup and electrically connected to the electrodes, an encapsulation covering the LED die, and a fluorescent film coated on an outer surface of the encapsulation.

In the package of the LEDs, the fluorescent substance is firstly mixed in fluid encapsulating material, then the fluid encapsulating material is sprayed on the outer surface of the encapsulation, and finally the fluid encapsulating material mixed with fluorescent substance is solidified. However, during the spraying process, a sprayed area and a sprayed thickness of the fluid encapsulating material by the spray tool are difficult to control since the operation of the spray tool has a certain tolerance regarding, for example, the movement of the spray tool and the flow rate of the fluid encapsulating material. Therefore, the fluorescent film will be non-uniform in thickness. Further, the fluorescent substance suspending in the encapsulating material will deposit and undesirably cause a non-uniform distribution of the fluorescent substance in the encapsulating material. The uneven distribution of the fluorescent substance in the encapsulating material and the uneven thickness of the fluorescent film cause light generated by the conventional LED to have an uneven color distribution.

Therefore, what is needed is to provide a method for packaging LEDs which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the method for packaging the LED packages, in detail.

Figure 9:
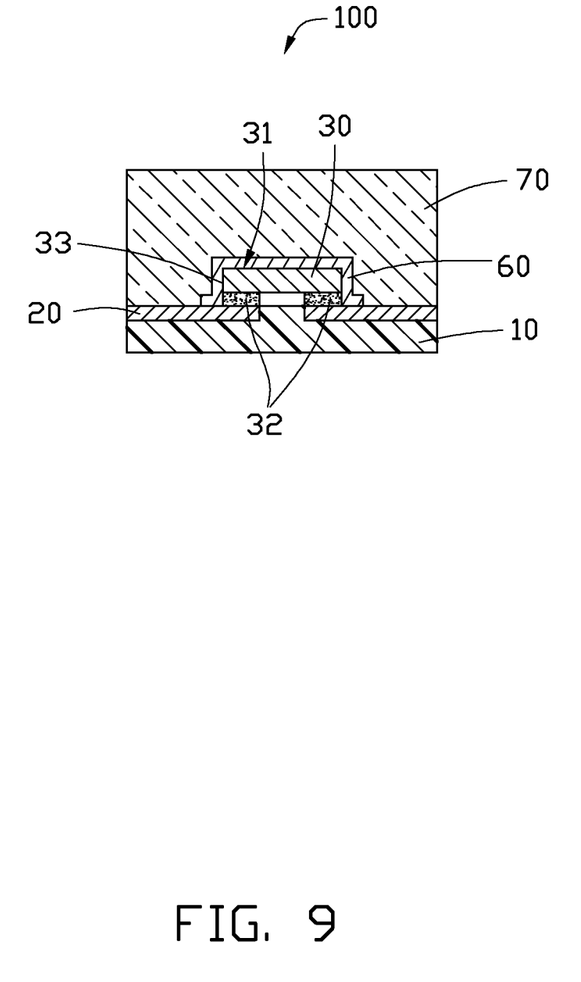

Referring to FIG. 9, an LED package 100 of an exemplary embodiment is provided. The LED package 100 includes a substrate 10, a circuit structure 20, an LED die 30, a fluorescent film 60, and an encapsulation 70. The circuit structure 20 is formed on the substrate 10. The LED die 30 is mounted on the substrate 10 and electrically connects to the circuit structure 20. The fluorescent film 60 is conformably attached on outer surfaces of the LED die 30. The encapsulation 70 is formed on the substrate 10 to cover the LED die 30 and the fluorescent film 60.

The LED die 30 is arranged on the circuit structure 20 by flip chip bonding. The LED die 30 includes a light outputting surface 31 on a top thereof away from the substrate 10, and four lateral sides 33 adjoining the outputting surface 31. Two electrode pads 32 are formed on a bottom surface of the LED die 30 away from the light outputting surface 31. The two electrode pads 32 face the circuit structure 20, and are electrically connected to the circuit structure 20. The fluorescent film 60 covers the outputting surface 31 and extends from the light outputting surface 31 to the circuit structure 20, traversing the lateral sides 33 of the LED die 30.

A method for manufacturing the LED package 100 in accordance with an embodiment of the present disclosure includes steps of:

Step 1: providing a substrate with a circuit structure formed thereon, stacking the substrate on a supporting board, and arranging a plurality of LED dies on the substrate;

Step 2: providing a mold and a gelatinous-state fluorescent film with a uniform thickness, positioning the supporting board with the substrate and the LED dies in the mold and positioning the gelatinous-state fluorescent film in the mold, wherein the film, the mold and the supporting board cooperatively define a receiving space thereamong, the substrate and the LED dies being received in the receiving space;

Step 3: exhausting air in the receiving space to attach the gelatinous-state fluorescent film on the LED dies;

Step 4: solidifying the gelatinous-state fluorescent film and removing the mold;

Step 5: forming an encapsulation on the substrate to cover the LED dies;

Step 6: cutting the substrate and removing the supporting board to obtain several individual LED packages.

Figure 1:
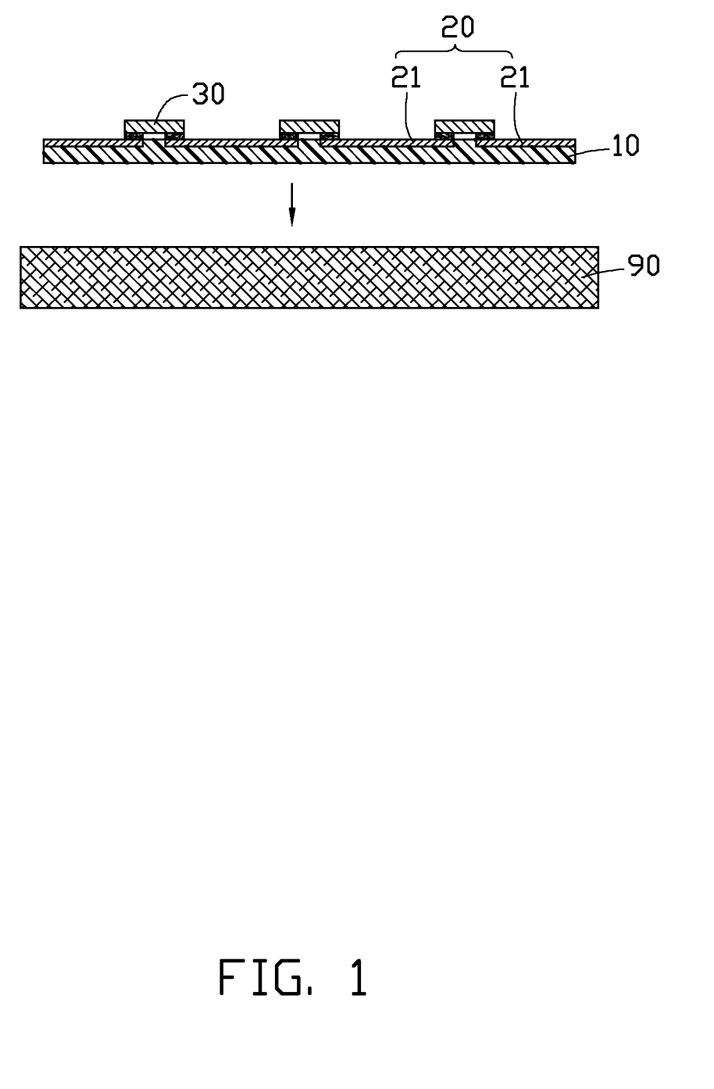
FIGS. 1-3, 5-9 are schematic cross sections showing LED packages processed by different steps of an LED packaging method in accordance with an embodiment of the present disclosure.

In step 1, referring to FIG. 1, a substrate 10 and a supporting board 90 are provided. The substrate 10 is stacked on the supporting board 90. A circuit structure 20 is formed on the substrate 10. The circuit structure 20 includes a plurality of electrodes 21 spaced from each other. A plurality of LED dies 30 are arranged on the substrate 10 and electrically connected to the electrodes 21. In this embodiment, there are six LED dies 30 arrayed in two rows, and each row has three LED dies 30. Each LED die 30 is corresponding to two electrodes 21 adjacent to each other. A size of the supporting board 90 is greater than that of the substrate 10. The supporting board 90 has a porous structure. The supporting board 90 can be made of materials with pores therein. Alternatively, the supporting board 90 can also be made of a solid plate with a plurality of through-holes defined therein.

Figure 2:
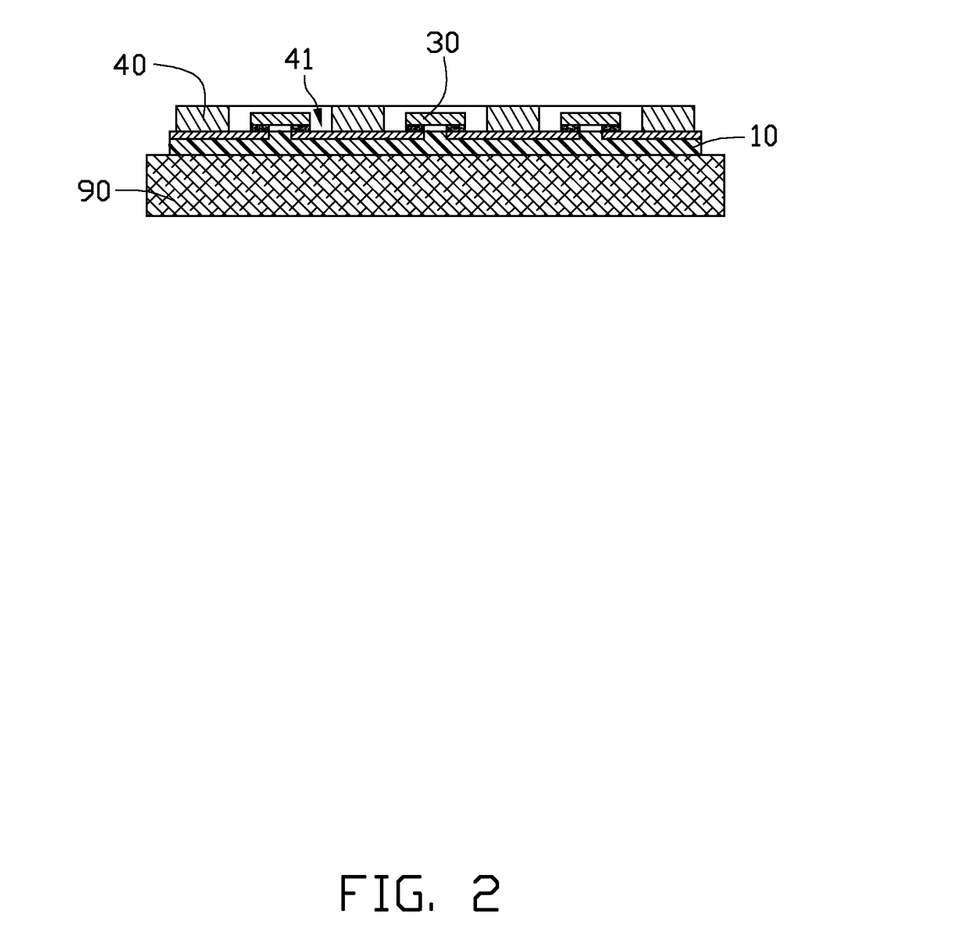

Referring to FIG. 2, in this embodiment, a shelter layer 40 is further stacked on the substrate 10 after the plurality of LED dies 30 are arranged on the substrate 10. A plurality of through holes 41 are defined in the shelter layer 40. Each through hole 41 has a size greater than that of each LED die 30, thereby receiving one corresponding LED die 30 therein.

Figure 3:
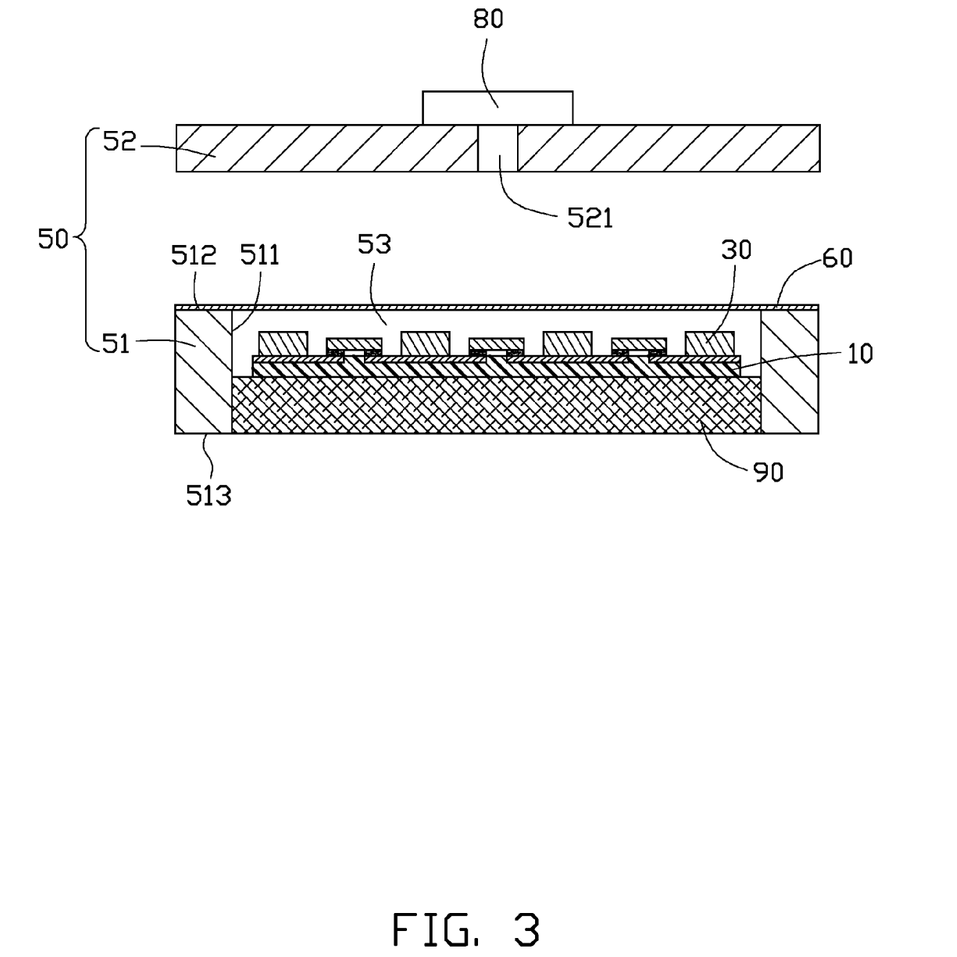
Figure 4:
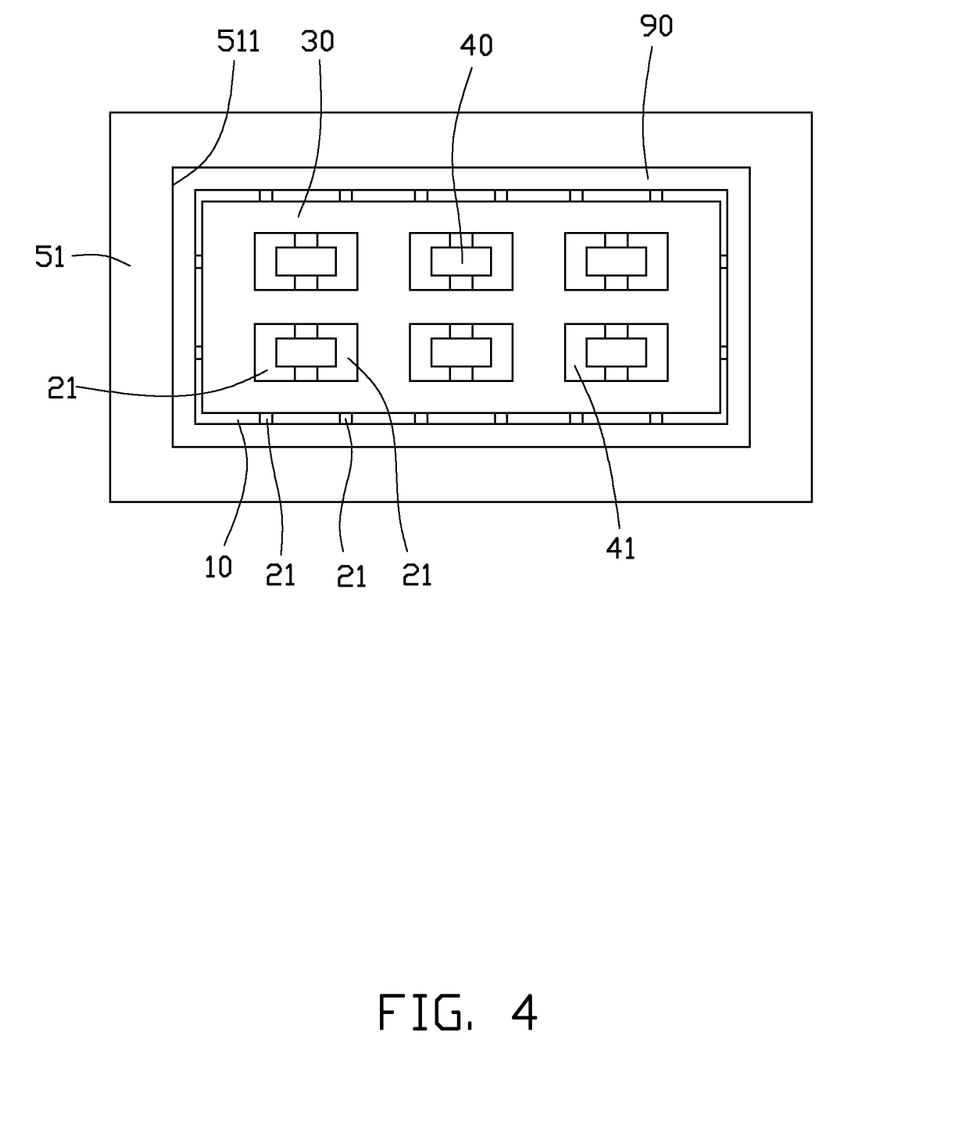
FIG. 4 is a schematic, top view of the LED packages processed by a step of an LED packaging method of FIG. 3, wherein a cover and a fluorescent film in FIG. 3 are omitted in FIG. 4 for illustration.

In step 2, referring to FIGS. 3-4, a mold 50 and a gelatinous-state fluorescent film 60 are provided. The mold 50 includes an annular frame 51 and a cover 52. The frame 51 includes a top surface 512, a bottom surface 513 and an inner sidewall 511 interconnecting the top and bottom surfaces 512,513. The frame 51 defines an inner space accommodating the substrate 10. A height of the frame 51 is greater than a sum of heights of the supporting board 90 and the substrate 10. An air vent 521 is defined in a middle portion of the cover 52. The supporting board 90 with the substrate 10 stacked thereon is positioned in the frame 51, with a bottom surface of the supporting board 90 coplanar with the bottom surface 513 of the mold 50. Lateral sides of the supporting board 90 abut against the inner sidewall 511 of the frame 51.

The gelatinous-state fluorescent film 60 has a uniform thickness, and covers the top surface 512 of the frame 51 to cooperatively define a receiving space 53 among the fluorescent film 60, the frame 51, and the supporting board 90. The frame 51 is covered by the gelatinous-state fluorescent film 60, and the substrate 10, the LED dies 30 and the shelter layer 40 are received in the receiving space 53. The gelatinous-state fluorescent film 60 is flexible and has a certain degree of stickiness. The gelatinous-state fluorescent film 60 is supported by the top surface 512 of the frame 50. The cover 52 is disposed on the gelatinous-state fluorescent film 60 whereby the gelatinous-state fluorescent film 60 is sandwiched between the cover 52 and the top surface 512 of the mold 50. An upper portion of the gelatinous-state fluorescent film 60 is communicated with an exterior of the mold 50 via the air vent 521. The receiving space 53, which receives the substrate 10 and the LED die 30 therein, is communicated with exterior of the mold 50 via the porous supporting board 90.

Figure 5:
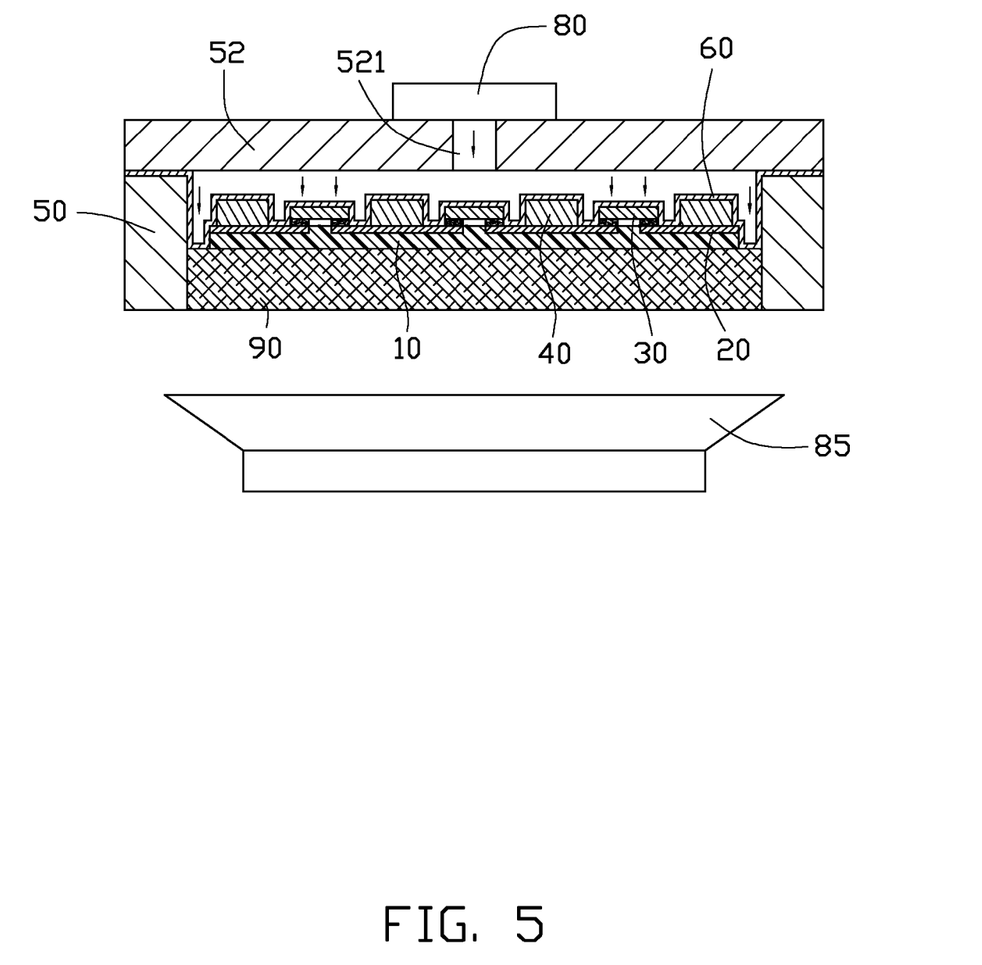

In step 3, referring to FIG. 5, the gelatinous-state fluorescent film 60 is attached on the LED dies 30 and the substrate 10 via exhausting air in the receiving space 53. A vacuum pump 85 can be employed in this step. In this embodiment, the vacuum pump 85 can be positioned under the mold 50 and the supporting board 90. Air in the receiving space 53 is pumped by the vacuum pump 85 downwardly out of the receiving space 53 to the external environment via the pores in the supporting board 90. Thus, the gelatinous-state fluorescent film 60 is totally attached on the LED die 30, the shelter layer 40, the circuit structure 20 and the substrate 10, under a vacuum pressure acting on the film 60. An air pump 80 can be further employed on the cover 52 and fixed above the air vent 521. The air pump 80 can supply air, via the air vent 521, toward the gelatinous-state fluorescent film 60 (as illustrated by arrows in FIG. 5), thereby downwardly pressing the gelatinous-state fluorescent film 60 to the LED dies 30 and substrate 10 to speed the operation and ensure a tight engagement between the film 60 and the LED dies 30 and the substrate 10.

Figure 6:
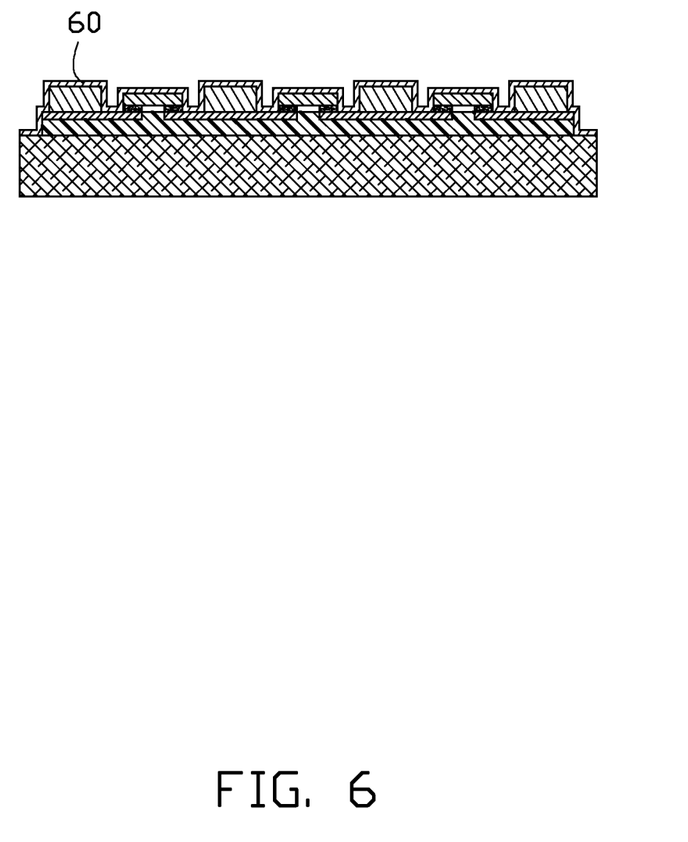

In step 4, referring to FIG. 6, the gelatinous-state fluorescent film 60 is solidified and then the mold 50 is removed. The gelatinous-state fluorescent film 60 can be solidified by heating. Alternatively, the mold 50 can be removed before the gelatinous-state fluorescent film 60 is solidified.

Figure 7:
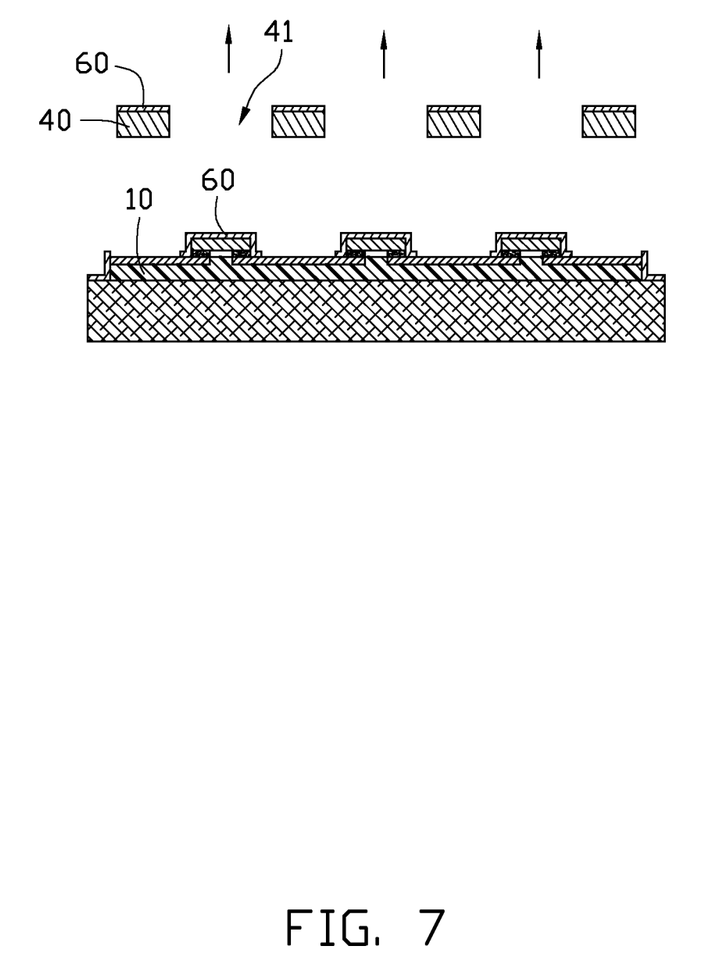

In this embodiment, referring to FIG. 7, after the gelatinous-state fluorescent film 60 is solidified, the shelter layer 40 is removed, together with a part of the fluorescent film 60 covering the shelter layer 40 which is located between two adjacent LED dies 30. A pre-cutting along the through-holes 41 of the shelter layer 40 can be performed before removing the shelter layer 40, thereby avoiding destroying the other part of the fluorescent film 60 which is on the LED dies 30 during the removal of the shelter layer 40.

Figure 8:
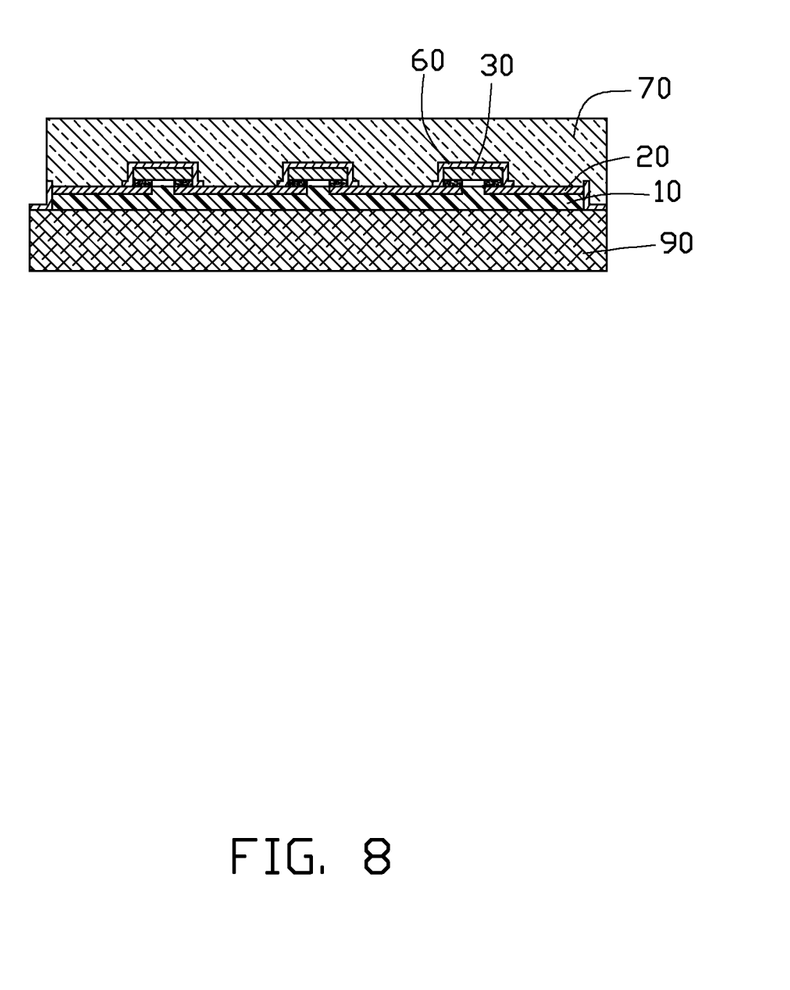

In step 5, referring to FIG. 8, an encapsulation 70 is formed on the substrate 10 to cover the LED dies 30 and the fluorescent film 60.

In above mentioned method, the shelter layer 40 is firstly provided but finally removed. As such, the circuit structure 20 between each two adjacent LED dies 30 originally covered by the fluorescent film 60 is exposed. Therefore, when the encapsulation 70 is formed on the substrate 10, the circuit structure 20 can have more contact area engaging with the encapsulation 70, thereby to make a joint between the circuit structure 20 and the encapsulation 70 more firm to enable the LED die 30 to be more waterproof and dustproof.

In step 6, referring to FIG. 9, the substrate 10 is cut into several individual pieces and the supporting board 90 is removed to obtain several individual LED packages 100.

In this method, the fluorescent film 60 is forced to be attached on the LED dies 30 under external vacuum pressure by exhausting air through the porous supporting board 90, and partially removed to expose the area desired to be uncovered and engaged with the encapsulation 70. As such, the fluorescent film 60 can be accurately formed on desired area, and a uniform distribution of fluorescent substance is obtained by employing a uniform fluorescent film prepared in advance. The shortcomings caused by deposition of fluorescent substance in the conventional fluid spraying process is avoided by the present disclosure.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for manufacturing an LED package, comprising steps:
   providing a substrate with a circuit structure formed thereon, stacking the substrate on a supporting board, and arranging a plurality of LED dies on the substrate;
   providing a mold and a gelatinous-state fluorescent film with a uniform thickness, positioning the supporting board with the substrate and the LED dies in the mold and positioning the gelatinous-state fluorescent film in the mold, the gelatinous-state fluorescent film cooperating with the mold and the supporting board to define a receiving space thereamong, the substrate and the LED dies being received in the receiving space;
   exhausting air in the receiving space to attach the gelatinous-state fluorescent film on the LED dies;
   solidifying the gelatinous-state fluorescent film and removing the mold;
   forming an encapsulation on the substrate to cover the LED dies; and
   cutting the substrate and removing the supporting board to obtain several individual LED packages;
   wherein the mold comprises an annular frame, and the receiving space is defined among the fluorescent film, the annular frame of the mold and the supporting board;
   wherein the frame comprises an inner sidewall, a top surface and a bottom surface, the supporting board abuts against the inner sidewall, and a bottom surface of the supporting board is coplanar with the bottom surface of the frame; and
   wherein the mold further comprises a cover with an air vent defined therein, the cover is positioned above the frame with the gelatinous-state fluorescent film sandwiched between the cover and the top surface of the frame.

2. The method for manufacturing the LED package of claim 1, wherein the supporting board has a porous structure, and a size of the supporting board is greater than that of the substrate.

3. The method for manufacturing the LED package of claim 1, wherein the gelatinous-state fluorescent film is supported by the top surface of the frame, the fluorescent film covers the top of the frame of the mold, and the substrate is positioned in the frame of the mold.

4. The method for manufacturing the LED package of claim 1, further comprising an air pump employed on the cover, wherein the air pump is fixed above the air vent to supply air toward the gelatinous-state fluorescent film via the air vent during the step of exhausting air in the receiving space.

5. The method for manufacturing the LED package of claim 1, further comprising a step of removing a part of the solidified fluorescent film between two adjacent LED dies from the fluorescent film before the step of forming an encapsulation on the substrate to cover the LED dies.

6. The method for manufacturing the LED package of claim 5, the step of removing a part of the solidified fluorescent film between two adjacent LED dies further comprises steps:

providing a shelter layer with a plurality of through holes defined therein before the step of providing a mold and a gelatinous-state fluorescent film;

positioning the shelter layer on the substrate and making each LED die be received in a corresponding through hole at the step of providing a mold and a gelatinous-state fluorescent film, wherein the step of exhausting air in the receiving space to attach the gelatinous-state fluorescent film on the LED dies causes the gelatinous-state fluorescent film to be also attached on the shelter layer; and     removing the shelter layer together with the part of the fluorescent film covering the shelter layer after the step of solidifying the gelatinous-state fluorescent film and removing the mold.

7. The method for manufacturing the LED package of claim 6, wherein a pre-cutting along the through holes of the shelter layer is performed before the step of removing the shelter layer.

8. The method for manufacturing the LED package of claim 1, the step of exhausting air in the receiving space is executed by a vacuum pump under the supporting board to exhaust air in the receiving space.

* * * * *